(12) United States Patent
Xiang et al.

(10) Patent No.: US 6,465,309 B1
(45) Date of Patent: Oct. 15, 2002

(54) SILICIDE GATE TRANSISTORS

(75) Inventors: Qi Xiang, San Jose, CA (US); Paul R. Besser, Austin, TX (US); Matthew Buynoski, Palo Alto, CA (US); John C. Foster, Mountain View, CA (US); Paul L. King, Mountain View, CA (US); Eric N. Paton, Morgan Hill, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/734,185

(22) Filed: Dec. 12, 2000

(51) Int. Cl.⁷ .............................. H01L 21/336
(52) U.S. Cl. ............. 438/299; 438/769; 438/592; 438/664
(58) Field of Search ............... 438/299–307, 438/592, 649, 655, 683, 663–664, 660, 769

(56) References Cited

U.S. PATENT DOCUMENTS

| | | | |
|---|---|---|---|
| 5,856,225 A | * 1/1999 | Lee et al. | 438/291 |
| 5,937,300 A | * 8/1999 | Sekine et al. | 438/300 |
| 5,960,270 A | 9/1999 | Misra et al. | |
| 6,054,355 A | * 4/2000 | Inumiya et al. | 438/296 |
| 6,087,231 A | * 7/2000 | Xiang et al. | 438/287 |
| 6,159,782 A | * 12/2000 | Xiang et al. | 438/197 |
| 6,200,865 B1 | * 3/2001 | Gardner et al. | 438/291 |
| 6,248,675 B1 | * 6/2001 | Xiang et al. | 438/926 |
| 6,284,613 B1 | * 9/2001 | Subrahmanyam et al. | 438/307 |
| 6,291,282 B1 | * 9/2001 | Wilk et al. | 438/203 |

* cited by examiner

Primary Examiner—Tuan H. Nguyen
Assistant Examiner—Thanh Nguyen

(57) ABSTRACT

A semiconductor structure and method for making the same provides a gate dielectric formed of oxynitride or a nitride/oxide stack formed within a recess. Amorphous silicon is deposited on the gate dielectric within the recess and a metal is deposited on the amorphous silicon. An annealing process forms a metal silicide gate within the recess on the gate dielectric. A wider range of metal materials can be selected because the gate dielectric formed of oxynitride or a nitride/oxide stack remains stable during the silicidation process. The metal silicide gate significantly reduces the sheet resistance between the gate and gate terminal.

14 Claims, 5 Drawing Sheets

SILICIDE GATE TRANSISTORS

RELATED APPLICATIONS

The present invention contains subject matter similar to that disclosed in U.S. application Ser. Nos. 09/691,181, filed Oct. 19, 2000; 09/731,031, filed Dec. 7, 2000; 09/734,189, filed Dec. 12, 2000, now U.S. Pat. No. 6,342,414, issued Jan. 29, 2002; 09/734,186, filed Dec. 12, 2000, now U.S. Pat. No. 6,368,950, issued Apr. 9, 2002; and 09/734,207, filed Dec. 12, 2000.

FIELD OF THE INVENTION

The present invention relates to semiconductor manufacturing technology, more particularly to the formation of metal silicide gate electrodes using the replacement gate process technique.

BACKGROUND OF THE INVENTION

Over the last few decades, the electronics industry has undergone a revolution by various efforts to decrease the size of device elements formed in integrated circuits (IC), and such efforts have contributed in increasing the density of circuit elements and device performance. A large variety of semiconductor devices have been manufactured having various applications in numerous disciplines.

Currently, the most common and important semiconductor technology presently used is silicon-based, and the most preferred silicon-based semiconductor device is a MOS (Metal Oxide Semiconductor) transistor. The principal elements of a typical MOS transistor generally comprise a semiconductor substrate on which a gate electrode is disposed. The gate electrode is typically a heavily doped conductor to which an input signal is typically applied via a gate terminal. Heavily doped active regions, e.g., source/drain regions, are formed in the semiconductor substrate and are connected to source/drain terminals. A channel region is formed in the semiconductor substrate beneath the gate electrode and separates the source/drain regions. The gate electrode is generally separated from the semiconductor substrate by a dielectric layer, e.g., an oxide layer, to prevent current from flowing between the gate electrode and the source/drain regions or channel regions.

Conventional process steps for fabricating a typical MOS transistor are depicted in FIGS. 1 to 8. First, as depicted in FIG. 1, an oxide layer is thermally grown on a semiconductor substrate 10, i.e., typically silicon, and a conductive layer, typically polysilicon, is formed over the oxide layer. The oxide layer and conductive layer are patterned and etched to form gate dielectric 12 and gate electrode 14, respectively. Then, as depicted in FIG. 2, impurity atoms. e.g., boron or phosphorus, are ion implanted into the surface of the silicon substrate 10, by utilizing the gate electrode 14 as a mask, to form shallow source/drain regions 16 on the main surface of the silicon substrate 10.

The ion implantation step is followed by an annealing step which normally involves a high temperature of 700° C. or higher to activate the implanted impurity atoms in the shallow source/drain regions 16 and to cure the damage caused by the physical impact to the crystal structure of the silicon substrate 10 when the impurity atoms are implanted thereto. Sidewall spacers 18 are then formed on the side surfaces of the gate dielectric 12 and gate electrode 14, as depicted in FIG. 3.

Subsequently, source/drain regions 20 are formed by ion implanting impurity atoms, e.g., boron or phosphorus, at the impurity implantation concentration and energy higher than those from the first annealing process, by utilizing the gate electrode 14 and the sidewall spacers 18 as a mask, as depicted in FIG. 4. Once again, the annealing process is performed at a high temperature of 700° C. or higher to activate the implanted impurity atoms in the source/drain regions 20 and to cure the damage caused by the implantation impact.

As transistor dimensions approached one micron in diameter, conventional parameters resulted in intolerably increased resistance between the active region 20 and conductive interconnect lines formed subsequently to interconnect various device elements in the integrated circuit device. The principle way of reducing such contact resistance is by forming a metal silicide atop the source/drain regions 20 and the gate electrodes 14 prior to application of the conductive film for formation of the various conductive interconnect lines. The most common metal silicide materials are $CoSi_2$ and $TiSi_2$.

As depicted in FIG. 5, a metal layer 22 is typically provided by first applying a thin layer of, for example, titanium, atop the wafer which contacts the source/drain regions 20. Then, the wafer is subjected to one or more annealing steps at the temperature of 800° C. or higher. This causes the titanium layer 22 to selectively react with the silicon of the source/drain regions 20 and the gate electrodes 14, thereby forming a metal silicide ($TiSi_2$) layer 24 selectively on the source/drain regions 20 and the gate electrodes 14. Such a process is referred to as a silicide (self-aligned silicide) process because the $TiSi_2$ layer 24 is formed only where the titanium material directly contacts the silicon source/drain regions 20 and the polycrystalline silicon gate electrode 14. Following the formation of the silicide layer 24, as depicted in FIG. 7, an interlayer dielectric film 26 is deposited over the entire surface of the substrate 10, and an interconnect process is performed (not shown) to provide conductive paths by forming via holes through the interlayer dielectric 26 and filling the via holes with a conductive material, e.g., tungsten.

As the dimensions of the MOS transistor are further scaled down to submicron and nanometer dimensions, the thickness of the gate oxide is also scaled down accordingly. However, such excessively reduced thickness of the gate oxide causes charge carrier leakage by tunneling effect, thereby leading to faster degradation of the MOS transistor.

To solve this problem, a high k (dielectric constant) gate dielectric. e.g., $ZrO_2$, $HfO_2$, $InO_2$, $LaO_2$, $TaO_2$, was introduced to replace the silicon oxide for submicron MOS devices. However, it has been also observed that the high k gate dielectric becomes thermally unstable during the high temperature process steps for fabrication of the MOS transistor. For example, as mentioned above, the source/drain region activation annealing steps in FIGS. 2 and 4 and the silicidation step in FIG. 6 are normally performed at a temperature of at least 700° C. or higher, or in some cases at a temperature of 1000° C. or higher. At such a high temperature, tantalum oxide ($Ta_2O$, ), another high k gate dielectric, is transformed from amorphous to crystalline, which causes charge carrier leakage. In addition, at such a high temperature, tantalum oxide undesirably interacts with the underlying silicon substrate or overlying polysilicon gate electrode of the MOS transistor.

To solve this problem, a metal gate electrode has been introduced to avoid the reaction between the high k gate dielectric and the polysilicon gate electrode during the high temperature processing steps. For example, as described in the U.S. Pat. No. 5,960,270 by Misra, et al. a metal deposition process was proposed to form a metal gate layer by depositing molybdenum, tungsten, tungsten silicide, nickel silicide, or titanium nitride. However, it has been also observed that the metal atoms from the gate electrode diffuse into the gate dielectric, thereby causing faster degradation of the high k gate dielectric, and both the high k gate dielectric and the metal gate electrode suffer structural stress from such high temperature process steps.

Thus, there is a continuing need for improved methods that enable implementation of a reliable gate structure in submicron MOS transistors without the undesirable side effects and complicated process steps.

SUMMARY OF THE INVENTION

These and other needs are met by the present invention that provides a semiconductor structure and arrangement for making the same in which a metal silicide gate is formed on an oxynitride gate dielectric layer or a nitride/oxide stack gate dielectric layer within semiconductor structures.

The semiconductor structure includes a substrate and active regions formed in the substrate. A gate structure, which includes a gate dielectric formed of oxynitride or a nitride/oxide stack and a metal silicide gate formed on the gate dielectric, is formed on the substrate. By providing a gate structure having a metal silicide gate electrode on a gate dielectric layer formed of oxynitride or a nitride/oxide stack, the thickness of the gate dielectric is advantageously scaled down without degradation of the gate dielectric. Also, by providing a metal silicide gate electrode, the sheet resistance between the gate electrode and a gate terminal is significantly reduced.

The aforementioned needs are also met by embodiments of the present invention that provides a method of forming a semiconductor structure, comprising the steps of forming a precursor having a substrate with active regions separated by a channel, and a temporary gate over the channel between dielectric structures. The temporary gate is removed to form a recess with a bottom and sidewalls between the dielectric structures. An gate dielectric formed of oxynitride or a nitride/oxide stack is formed on the bottom of the recess. Silicon is deposited in the recess on the gate dielectric. A metal is deposited in the recess on the silicon. Finally, annealing is performed to cause the metal and the silicon to react to form a metal silicide gate in the recess on the oxynitride gate dielectric.

By providing a gate dielectric formed of oxynitride or a nitride/oxide stack, which remain stable during the subsequent high temperature process steps, i.e., metal silicidation process at approximately 700° C. or higher, a wider range of metal materials can be selected to font the metal silicide and a reliable gate dielectric having a scaled down thickness is obtained. Also, since metal silicide is provided as a gate electrode in replacement of conventional polysilicon or a metal, the sheet resistance between the gate electrode and the gate terminal, e.g., metal lines, is significantly reduced.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the invention is capable of other and different embodiments, and its several details are capable of modifications in various obvious respects, all without departing from the present invention. Accordingly, the drawings and description are to be regarded as illustrative in nature, and not as restrictive.

BRIEF DESCRIPTION OF THE DRAWINGS

The present invention is illustrated by way of example, and not by way of limitation, in the figures of the accompanying drawings and in which like reference numerals refer to similar elements in which.

DETAILED DESCRIPTION OF THE EXEMPLARY EMBODIMENTS

The method and apparatus described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-section portions of a semiconductor chip or a substrate during fabrication are not drawn to scale, but instead are drawn to illustrate the feature of the present invention.

Figure 8:
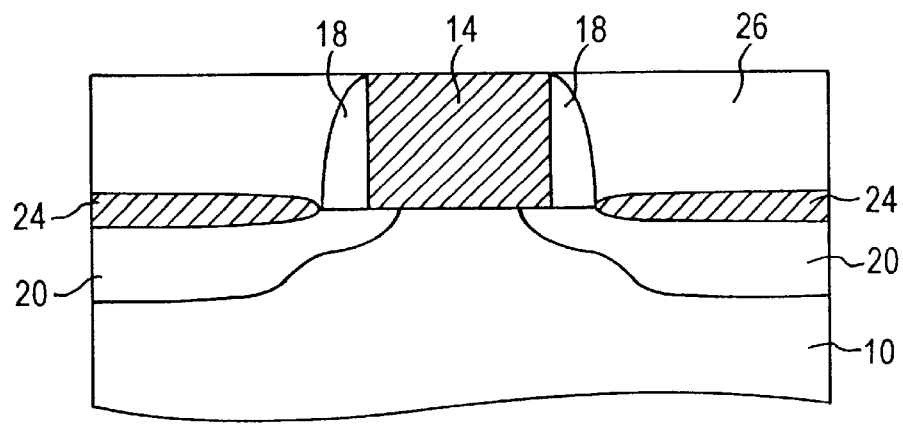
FIG. 8 is a schematic depiction of a cross-section of a semiconductor structure precursor in accordance with embodiments of the present invention.

The present invention provides a semiconductor structure and a method for implementing reliable gate dielectrics and metal silicide gates in semiconductor structures without the problems accompanied in conventional methods. This is achieved by forming a gate dielectric formed of oxynitride or a nitride/oxide stack in replacement of conventional gate dielectric formed of silicon oxide or high k materials. Unlike high k materials, gate dielectrics formed of oxynitride or the nitride/oxide stack are less likely to become unstable and interact with the underlying silicon substrate during the high temperature process steps. Thus, the subsequent gate electrode formation step is not limited to a certain temperature range, for example, approximately 600° C. or lower. Since the present invention enables forming the gate electrodes at the temperature of between approximately 400° C. and approximately 800° C., high temperature silicidation metals, e.g., cobalt, as well as low temperature silicidation metals, e.g., nickel, can be used to form metal silicide gate electrodes instead of conventional polysilicon or metals. By using metal silicide as the gate electrode, the present invention significantly reduces the sheet resistance between the gate electrode and its interconnect lines, i.e., metal lines. Also, according to an aspect of the present invention, temporary gate techniques are used to confine the gate electrode structure within a recess formed over a channel region, thereby simplifying shaping the gate electrode by a single planarization With this in mind, FIG. 8 is a cross-section of a precursor for the semiconductor structure constructed in accordance with embodiments of the present invention. In FIG. 8, a silicon substrate 10 has active regions 20 formed therein by conventional ion implantation and subsequent annealing techniques. A silicide layer 24 is formed atop the active regions 20 to reduce the resistance between the active regions 20 and conductive interconnect lines which will be formed subsequently.

A polysilicon gate 14, which serves as a temporary gate, is provided on top of the channel. sidewall spacers 18 are provided on the sidewalls of the gate 14, and interlayer dielectric 26 is provided to cover the active regions 20 and the silicide layer 24. Although it is not shown, if necessary, a silicon oxide gate dielectric could be formed between the substrate 10 and the gate 14.

Figure 9:
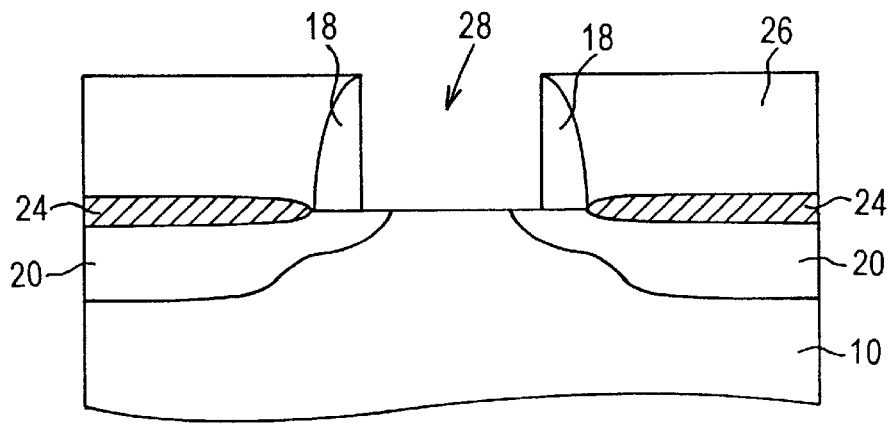
FIG. 9 depicts the portion of FIG. 8, after the temporary gate electrode has been removed to form a recess.

In FIG. 9, the temporary gate 14 is removed from the region between the sidewall spacers 18. A plasma reactive ion etch (RIE) using chlorine or a wet polysilicon etch using conventional etch chemistry may be utilized to remove the polysilicon gate 14 to form an opening (i.e., recess) 28.

Figure 10:
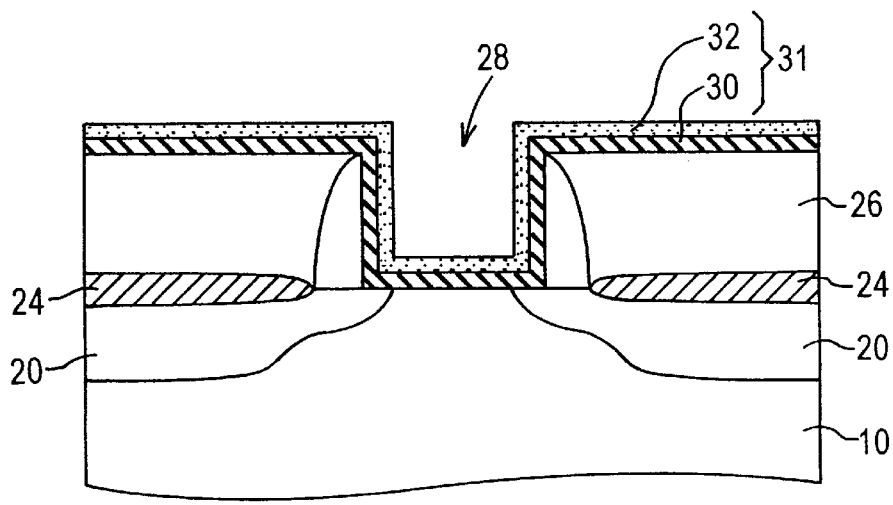
FIG. 10 depicts the portion of FIG. 9, after a gate dielectric formed of a nitride/oxide stack is deposited on the surfaces of the recess and over the interlayer dielectric layer.

Subsequently, as depicted in FIG. 10, a dielectric layer is formed over the semiconductor structure, particularly on the bottom of the recess 28 to form a gate dielectric 31. The gate dielectric 31 is either a stack of nitride/oxide layers 32, 30, as particularly depicted in FIG. 9, or an oxynitride layer. The gate dielectric layer 31 has a thickness between approximately 10 Å and approximately 25 Å, for example.

The oxynitride gate dielectric can be formed by conventional thermal growth or chemical vapor deposition (CVD). For example, oxynitride is thermally grown in a $N_2O$, NO or $NH_3$ ambient at a temperature between approximately 700° C. and approximately 1000° C. for a period between approximately 30 seconds and approximately 90 seconds. In another aspect of the invention, the stack of nitride/oxide layers 32, 30 can be formed by thermally growing oxynitride 30 at the thickness between approximately 5 Å and approximately 8 Å over the semiconductor structure, particularly on the bottom of the recess 28, and subsequently chemical vapor depositing silicon nitride 32 over the oxynitride layer 30. As previously mentioned, a reason for using oxynitride or a silicon nitride/oxynitride stack is that conventional silicon dioxide is no longer extendable and a high k gate dielectric becomes unstable during the subsequent high temperature process steps.

Figure 1:
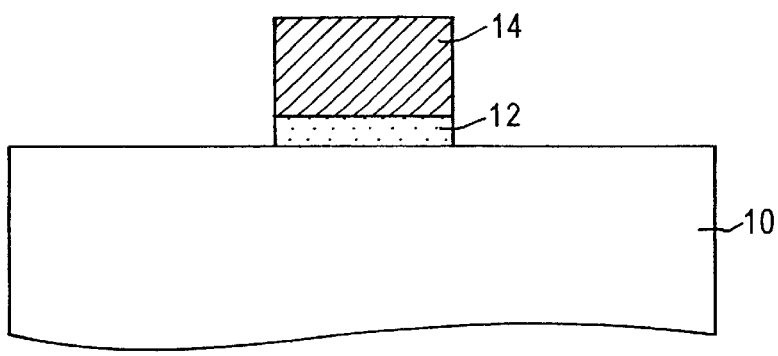
FIG. 1 is a schematic depiction of a cross-section of a prior art semiconductor structure, in which a gate electrode is formed on a semiconductor substrate with a gate oxide therebetween.
Figure 2:
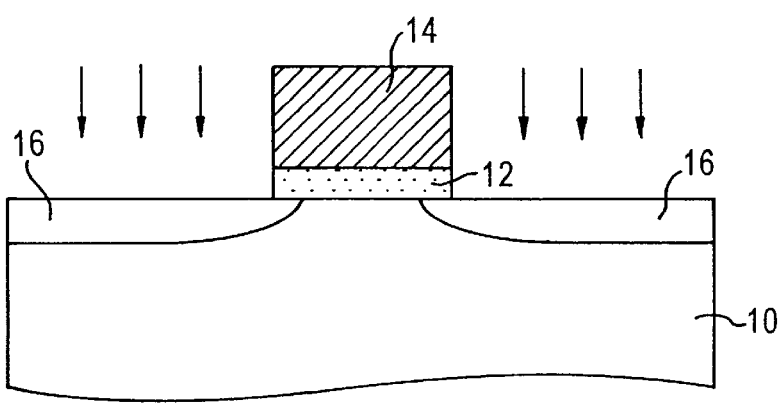
FIG. 2 depicts the portion of FIG. 1, during the first ion implantation process to form shallow source and drain regions on the main surface of the substrate.
Figure 3:
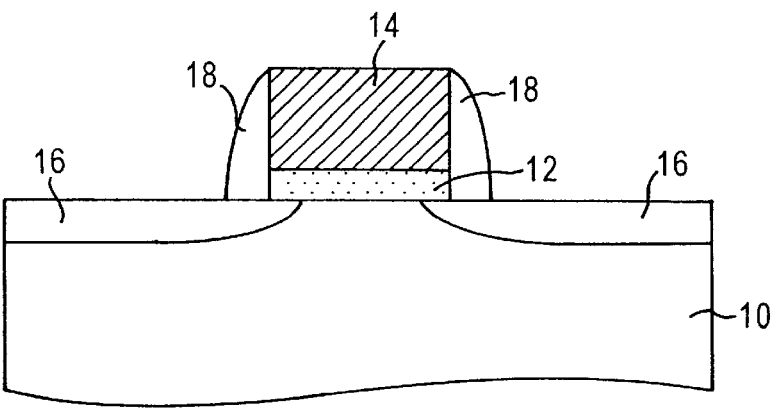
FIG. 3 depicts the portion of FIG. 2, after the first annealing process and a sidewall spacer formation process.
Figure 4:
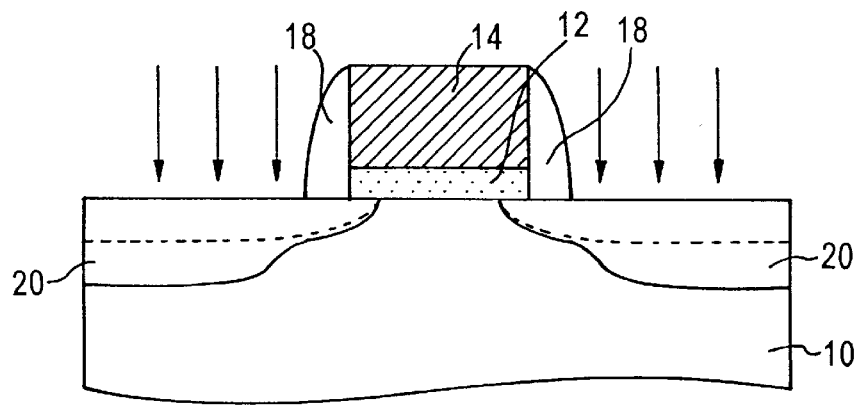
FIG. 4 depicts the portion of FIG. 3, during the second ion implantation process to form source and drain regions on the main surface of the substrate.
Figure 5:
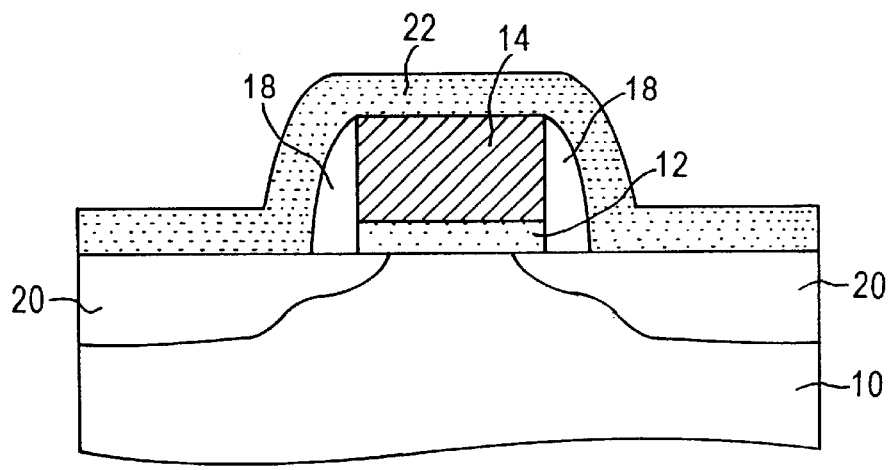
FIG. 5 depicts the portion of FIG. 4, after the second annealing process and a metal layer deposition process.
Figure 6:
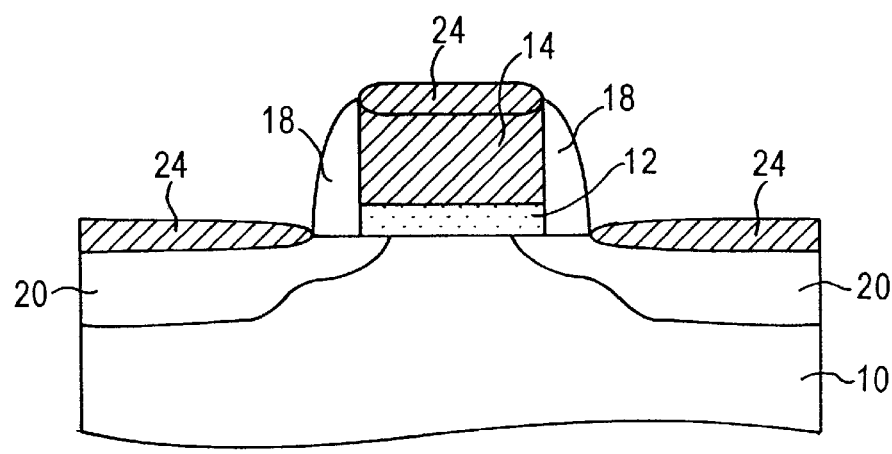
FIG. 6 depicts the portion of FIG. 5, after a silicidation process to form a metal silicide layer on the source and drain regions and the gate electrode.
Figure 7:
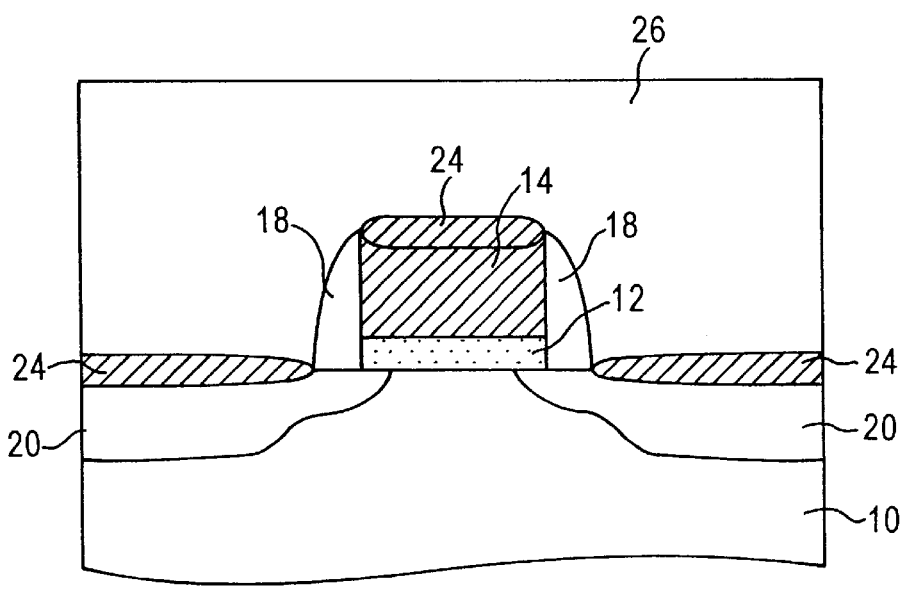
FIG. 7 depicts the portion of FIG. 6, after an interlayer dielectric layer is formed over the semiconductor structure.
Figure 11:
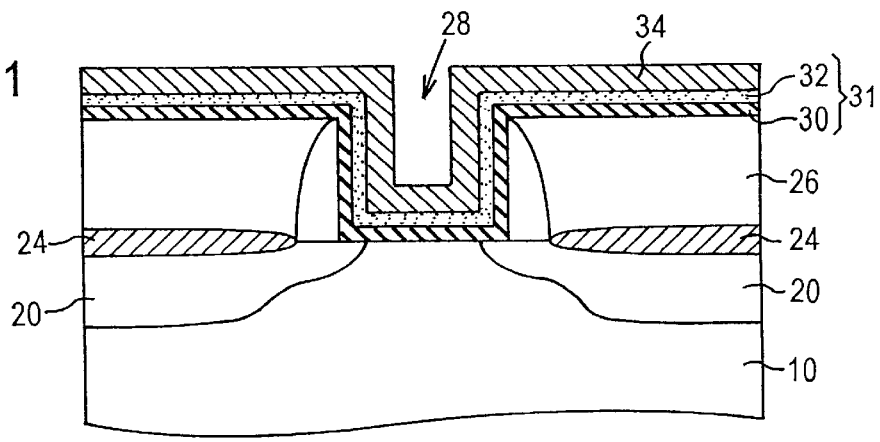
FIG. 11 depicts the portion of FIG. 10, after amorphous silicon has been deposited over the nitride/oxide stack gate dielectric.

FIG. 11 depicts the semiconductor structure of FIG. 3, after deposition of an amorphous silicon layer 34. For example, the amorphous silicon layer 32 is provided within the recess 28 on top of the gate dielectric layer 31 by conventional chemical vapor deposition (CVD) at a thickness between approximately 500 Å and approximately 1500 Å.

Figure 12:
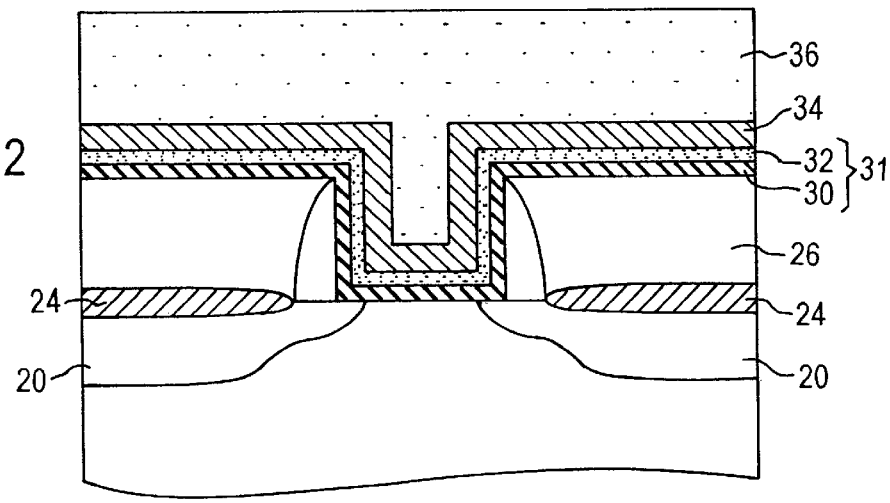
FIG. 12 depicts the portion of FIG. 11, after a metal has been deposited over the amorphous silicon.

Following the deposition of the amorphous silicon 34, as depicted in FIG. 12, a metal layer 36 is provided having a thickness between approximately 1000 Å and approximately 2000 Å. Since the gate dielectric 31 endures and does not become unstable during high temperature process steps, a wide range of silicide metal materials can be used, for example, manganese, cobalt, yttrium, platinum or palladium, thereby not limited to low temperature silicidation metals, e.g., nickel.

Figure 13:
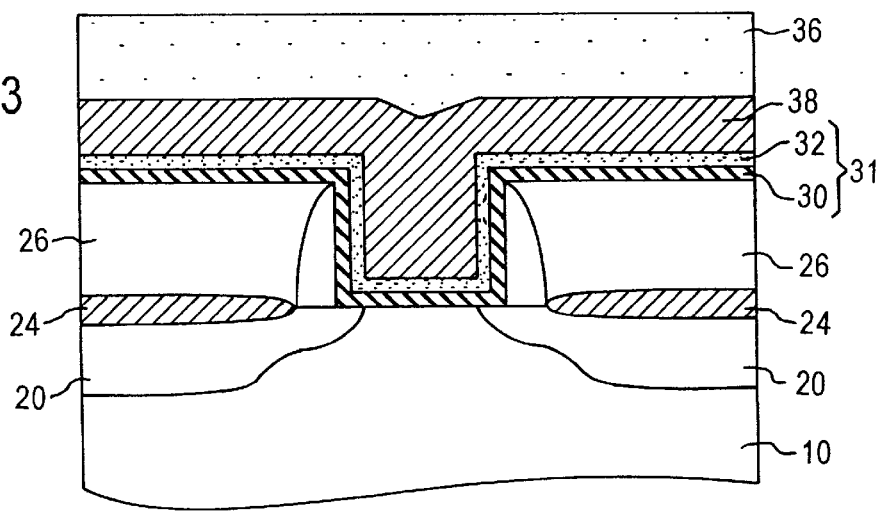
FIG. 13 depicts the portion of FIG. 12, after annealing to form a metal silicide layer within the recess and over the interlayer dielectric film.

Subsequently, in FIG. 13, annealing is performed to cause silicidation between the amorphous silicon 34 and its overlying metal 36 and thus to form a metal silicide layer 38, e.g., manganese silicide, cobalt silicide, yttrium silicide, platinum silicide or palladium silicide, over the dielectric layer 31 and particularly within the recess 28. The annealing may be performed by conventional rapid thermal annealing at a temperature between approximately 400° C. and approximately 800° C. for a period of between approximately 20 seconds and approximately 60 seconds. As previously mentioned, the gate dielectric layer formed of oxynitride or a nitride/oxynitride stack remains stable at the temperature approximately 600° C. or higher, so that a wide range of silicidation metals can be selected to form metal silicide gate electrodes.

Figure 14:
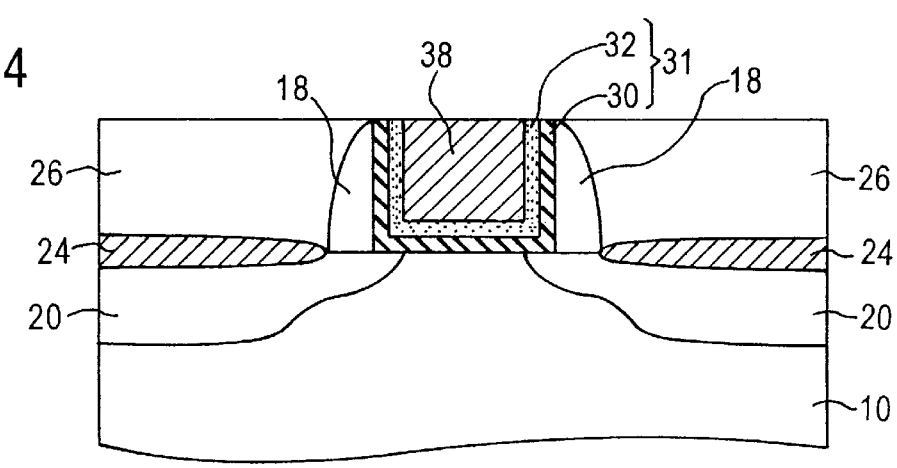
FIG. 14 depicts the portion of FIG. 13, after the semiconductor structure is planarized to form a metal silicide gate electrode within the recess.

Since the silicidation has occurred throughout the entire interface between the amorphous silicon 34 and its overlying metal layer 36, as depicted in FIG. 14, planarization is performed to remove the unreacted portion of the metal layer 36 and to shape the metal silicide gate 38 within the recess 28, by chemical mechanical polishing (CMP).

Thus, the present invention enables implementation of a high temperature metal silicide gate electrode over an oxynitride or a nitride/oxide stack gate dielectric, thereby solving problems accompanied by conventional silicon oxide or high k materials. Since the gate dielectric is formed of oxynitride or a stack of nitride/oxide layers, a wider range of silicidation metal materials can be selected to form gate electrodes. Also, the present invention reduces the sheet resistance between the gate electrode and its interconnect line, e.g., metal lines, by using a metal silicide as a gate electrode.

Although the present invention has been described and illustrated in detail, it is to be clearly understood that the same is by way of illustration and example only and is not to be taken by way of limitation. the scope of the present invention being limited only by the terms of the appended claims.

What is claimed is:

1. A method for forming a semiconductor structure, comprising the steps of:

forming a precursor having a substrate with active regions separated by a channel, and a temporary gate over the channel between dielectric structures;

removing the temporary gate to form a recess with a bottom and sidewalls between the dielectric structures;

forming a gate dielectric comprising oxynitride on the bottom of the recess;

depositing silicon in the recess on the gate dielectric;

depositing a metal in the recess on the silicon; and annealing to cause the metal and the silicon to react to form a metal silicide gate in the recess on the oxynitride gate dielectric.

2. The method of claim 1, further comprising the step of planarizing the semiconductor structure to remove the metal silicide gate except for a portion confined within the recess.

3. The method of claim 2, wherein the planarization is performed by a chemical mechanical polishing.

4. The method of claim 1, a thickness of the gate dielectric is between approximately 10 Å and approximately 25 Å.

5. The method of claim 1, wherein the oxynitride gate dielectric is formed by a thermal growth or a chemical vapor deposition (CVD).

6. The method of claim 5, wherein the oxynitride gate is thermally grown in a $N_2O$, NO or $NH_3$ ambient at a temperature between approximately 700° C. and approximately 1000° C. for a period between approximately 30 seconds and approximately 90 seconds.

7. The method of claim 1, wherein the gate dielectric is a nitride/oxide stack gate dielectric formed of oxynitride and silicon nitride and is formed by:

thermally growing oxynitride on the substrate; and depositing silicon nitride by a chemical vapor deposition (CVD) on the oxide.

8. The method of claim 7, wherein the thickness of the oxynitride in the nitride/oxide stack is between approximately 5 Å and approximately 8 Å.

9. The method of claim 7, wherein a thickness of the silicon nitride in the nitride/oxide stack is between approximately 5 Å and approximately 15 Å.

10. The method of claim 1, wherein the silicon is amorphous silicon.

11. The method of claim 10, wherein a thickness of the amorphous silicon is between approximately 500 Å and approximately 1500 Å.

12. The method of claim 1, wherein the metal is manganese, cobalt, yttrium, platinum or palladium, titanium, nickel, and tungsten.

13. The method of claim 12, wherein a thickness of the metal is between approximately 1000 Å and approximately 2000 Å.

14. The method of claim 1, wherein the annealing is performed by a rapid thermal annealing at a temperature between approximately 400° C. and approximately 800° C. for a period of between approximately 20 seconds and approximately 60 seconds.

* * * * *